United States Patent
Shcheglov et al.

(10) Patent No.: US 10,278,281 B1
(45) Date of Patent: Apr. 30, 2019

(54) MEMS STRESS ISOLATION AND STABILIZATION SYSTEM

(71) Applicant: Garmin International, Inc., Olathe, KS (US)

(72) Inventors: Kirill V. Shcheglov, Duarte, CA (US); Nolan F. Maggipinto, Santa Barbara, CA (US); David Smukowski, Seattle, WA (US); Chien-Heng Sun, Goleta, CA (US)

(73) Assignee: Garmin International, Inc., Olathe, KS (US)

( * ) Notice: Subject to any disclaimer, the term of this patent is extended or adjusted under 35 U.S.C. 154(b) by 21 days.

(21) Appl. No.: 15/337,436

(22) Filed: Oct. 28, 2016

Related U.S. Application Data

(60) Provisional application No. 62/249,019, filed on Oct. 30, 2015.

(51) Int. Cl.
- *H05K 1/18* (2006.01)
- *H05K 1/02* (2006.01)
- *G01D 3/036* (2006.01)

(52) U.S. Cl.
CPC .......... *H05K 1/0271* (2013.01); *G01D 3/036* (2013.01); *H05K 1/0212* (2013.01); *H05K 1/185* (2013.01); *H05K 2201/068* (2013.01); *H05K 2201/10151* (2013.01); *H05K 2201/10378* (2013.01)

(58) Field of Classification Search
CPC ......... G01D 3/036; H05K 2201/10378; H05K 2201/068; B81B 7/0009; B81B 7/0012; B81B 7/0016; B81B 7/0019; B81B 2207/11; B81B 3/0081; B81B 7/0087; B81B 7/0048

See application file for complete search history.

(56) References Cited

U.S. PATENT DOCUMENTS

| | | | | |
|---|---|---|---|---|
| 5,021,864 A | * | 6/1991 | Kelly | ............... H01L 23/49503 257/676 |
| 5,272,113 A | * | 12/1993 | Quinn | ............... G06K 7/10841 156/80 |
| 6,079,272 A | | 6/2000 | Stell | |

(Continued)

FOREIGN PATENT DOCUMENTS

WO   WO 2005/100237   10/2005

OTHER PUBLICATIONS

U.S. Appl. No. 15/337,480, filed Oct. 28, 2016, Shcheglov.

(Continued)

*Primary Examiner* — Harshad R Patel
*Assistant Examiner* — Tran M. Tran
(74) *Attorney, Agent, or Firm* — Samuel M. Korte; Max M. Ali

(57) ABSTRACT

A MEMS thermal stress isolation system is disclosed. The MEMs thermal stress isolation system is a MEMS embedded hardware implementation designed to isolate the sensitive sensor die from external stresses caused by rigid attachment to packaging and to allow the sensor to perform with improved immunity to the negative impacts of rigid sensor packaging attachment. A planar, micro-etched interface structure is integrated into the MEMS wafer stack, which serves as the mechanical connection between the MEMS sensor and the external packaging.

23 Claims, 4 Drawing Sheets

(56) References Cited

U.S. PATENT DOCUMENTS

| | | | |
|---|---|---|---|
| 6,257,060 B1* | 7/2001 | Leonardson | G01P 15/0802 73/514.29 |
| 6,360,601 B1 | 3/2002 | Challoner | |
| 6,367,786 B1 | 4/2002 | Gutierrez | |
| 6,467,346 B1 | 10/2002 | Challoner | |
| 6,584,845 B1 | 7/2003 | Gutierrez | |
| 6,598,455 B1 | 7/2003 | Raevis | |
| 6,675,630 B2 | 1/2004 | Challoner | |
| 6,768,196 B2* | 7/2004 | Harney | B81B 7/0048 257/729 |
| 6,796,179 B2 | 9/2004 | Youngsam | |
| 6,822,318 B2* | 11/2004 | Honer | H01L 21/50 257/669 |
| 6,823,734 B1 | 11/2004 | Hayworth | |
| 6,882,964 B2 | 4/2005 | Bayard | |
| 6,915,215 B2 | 7/2005 | M'Closkey | |
| 6,917,525 B2* | 7/2005 | Mok | G01R 1/06716 361/767 |
| 6,944,931 B2 | 9/2005 | Shcheglov | |
| 6,946,742 B2* | 9/2005 | Karpman | B81B 7/0048 257/707 |
| 6,955,084 B2 | 10/2005 | Challoner | |
| 6,990,863 B2 | 1/2006 | Challoner | |
| 7,017,410 B2 | 3/2006 | Challoner | |
| 7,037,805 B2* | 5/2006 | DCamp | B81C 1/00333 257/E21.51 |
| 7,040,163 B2 | 5/2006 | Shcheglov | |
| 7,159,441 B2 | 1/2007 | Challoner | |
| 7,168,318 B2 | 1/2007 | Challoner | |
| 7,280,262 B1* | 10/2007 | Foster | B81B 7/0048 359/247 |
| 7,285,844 B2 | 10/2007 | Hayworth | |
| 7,381,630 B2* | 6/2008 | Sawyer | B81B 7/0048 257/E21.122 |
| 7,437,253 B2 | 10/2008 | Shcheglov | |
| 7,793,541 B2* | 9/2010 | Challoner | G01C 19/5684 73/493 |
| 7,818,871 B2 | 10/2010 | Shcheglov | |
| 7,830,003 B2* | 11/2010 | Foster | B81B 7/0048 257/723 |
| 7,889,030 B2* | 2/2011 | Schoen | B81B 3/007 257/415 |
| 8,327,526 B2* | 12/2012 | Ge | B81B 7/0048 29/595 |
| 8,436,433 B1* | 5/2013 | Isebrand | H01L 23/055 257/415 |
| 8,575,954 B2* | 11/2013 | Chong | G01R 3/00 324/754.07 |
| 8,614,491 B2* | 12/2013 | Glenn | H01L 21/52 257/415 |
| 8,618,675 B2* | 12/2013 | Ding | B81B 7/0048 257/778 |
| 8,803,262 B2* | 8/2014 | Childress | B81B 7/0048 257/417 |
| 8,809,135 B2* | 8/2014 | Sawyer | B81B 7/0048 216/2 |
| 8,901,681 B1* | 12/2014 | Foster | B81B 7/0048 257/415 |
| 8,921,164 B2* | 12/2014 | Fonk | B81B 1/00238 257/667 |
| 8,969,981 B2* | 3/2015 | Kanai | H01L 23/055 257/419 |
| 9,010,190 B2* | 4/2015 | Potasek | B81B 7/0048 73/715 |
| 9,187,313 B2* | 11/2015 | Eskridge | B81B 7/0051 |
| 9,227,837 B2* | 1/2016 | Reinmuth | B81B 3/0048 |
| 9,327,964 B2* | 5/2016 | Allegato | B81B 7/0074 |
| 9,340,409 B1* | 5/2016 | Gurin | B81B 7/0048 |
| 9,343,367 B2* | 5/2016 | Goida | H01L 21/78 |
| 9,409,768 B2* | 8/2016 | DeNatale | G01C 19/5712 |
| 9,499,393 B2* | 11/2016 | Gu | B81B 7/0048 |
| 9,541,395 B2* | 1/2017 | Fell | B81B 7/0048 |
| 9,574,959 B2* | 2/2017 | Han | B81B 7/0048 |
| 9,686,864 B2* | 6/2017 | Walmsley | H05K 1/18 |
| 9,731,961 B2* | 8/2017 | Lloyd | B81B 7/0054 |
| 9,769,554 B2* | 9/2017 | Brioschi | B81B 7/0058 |
| 9,841,341 B2* | 12/2017 | Fontana | G01L 19/148 |
| 9,914,639 B2* | 3/2018 | Duqi | B81B 3/0051 |
| 10,023,461 B2* | 7/2018 | Picco | B81B 7/0058 |
| 2005/0258525 A1* | 11/2005 | Anderson | F16F 1/18 257/678 |
| 2007/0200253 A1* | 8/2007 | Gogoi | B81B 7/0048 257/779 |
| 2007/0205473 A1* | 9/2007 | Youngner | B81B 7/0087 257/414 |
| 2007/0246665 A1* | 10/2007 | LaFond | B81B 7/0048 250/548 |
| 2014/0054742 A1* | 2/2014 | Katti | H01L 23/5223 257/503 |
| 2015/0102434 A1* | 4/2015 | Maggi | B81C 1/00238 257/415 |
| 2016/0039664 A1* | 2/2016 | Lodden | B81C 1/00269 257/414 |
| 2016/0090297 A1* | 3/2016 | Zhang | B81B 7/0048 257/417 |
| 2017/0022051 A1* | 1/2017 | Xue | B81B 7/0048 |
| 2017/0073218 A1* | 3/2017 | Kaanta | B81B 7/0048 |
| 2017/0081177 A1* | 3/2017 | Neul | B81B 7/0048 |
| 2017/0088416 A1* | 3/2017 | Tocchio | B81B 7/0048 |

OTHER PUBLICATIONS

U.S. Appl. No. 15/337,572, filed Oct. 28, 2016, Shcheglov.
U.S. Appl. No. 15/337,627, filed Oct. 28, 2016, Shcheglov.
U.S. Appl. No. 15/337,681, filed Oct. 28, 2016, Shcheglov.

* cited by examiner

MEMS STRESS ISOLATION AND STABILIZATION SYSTEM

PRIORITY CLAIM

The present application claims priority to U.S. Provisional Patent Application Ser. No. 62/249,019, filed Oct. 30, 2015, entitled "MEMS Stress Isolation and Stabilization System," the entirety of which is hereby incorporated by reference.

BACKGROUND

1. Field

The present disclosure relates generally to micro-electromechanical sensors (MEMS). More particularly, the present disclosure relates to isolation of MEMS, and, in particular, thermal isolation and stabilization systems for MEMS.

2. Related Art

In high performance MEMS systems, one of the major challenges that impacts sensor performance is MEMS attachment to external packaging. MEMS systems typically require the sensor die to be rigidly attached to external packaging to ensure mechanical stability in the connection as well as to maintain sensor alignment to the sensing axis. However, if the attachment between package and die is not properly controlled, rigid attachment can negatively impact sensor performance by introducing undesirable stresses to the MEMS die. Thermomechanical stress caused by material thermal expansion mismatch between package and MEMS die and external mechanical stress on the package are two of the leading contributors to the stress that propagates through the rigid die attachment to negatively impact the sensor die.

For many MEMS sensors, maintaining maximum sensor performance across temperature is a major challenge. Typically, the output of MEMS sensors will reflect the impact of the changing thermal environment causing diminished sensor output performance and stability. In MEMS systems this performance degradation issue is addressed using a range of hardware and software techniques.

In MEMS systems that behave in a repeatable manner as their temperature is changed, thermal recalibration is a common approach to achieve improved sensor performance. Thermal recalibration is done by first thermally characterizing the system across temperature to define the relationship between temperature and sensor output. A calibration factor is then applied to the sensor's output to compensate for the changing thermal environment. The advantage of this approach is that it can be easily applied to most systems using a primarily software implementation with no major hardware changes or increased power.

However, there are some fundamental limitations to this type of thermal solution. The most major limitation for thermal recalibration is that the accuracy of the thermal recalibration correction factor is driven primarily by the thermal repeatability and hysteresis of the MEMS sensor. In the majority of MEMS sensors, the thermal repeatability of the MEMS sensor is significantly worse than the sensor stability performance at a fixed temperature. This means that in a changing thermal environment, regardless of the sophistication of the calibration algorithm, the sensor will have an inherent reduction in its stability performance.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention provide a MEMS thermal stress isolation and thermal stabilization system, which includes a supplemental interface structure integrated into the MEMS stack for thermal insulation and thermomechanical isolation. The thermal stress isolation and thermal stabilization system may also include an embedded current carrying conductive element for applying a heat input to the system.

According to one aspect of the invention, a sensor is disclosed that includes a MEMS sensor device; an interposer structure mechanically connected to the MEMS sensor device; and external packaging, the interposer structure mechanically connected to the external packaging, the MEMS sensor device hermetically sealed in the external packaging, wherein the interposer structure is configured to mechanically insulate the MEMS sensor device from the external packaging, and wherein the interposer structure is mechanically connected to the MEMS sensor device and the external packaging to increase a thermal distance between the MEMS sensor device and external packaging.

According to another aspect of the invention, a sensor is disclosed that includes a MEMS sensor device comprising a thermal stabilization system; and an interface structure coupled to the MEMS sensor device, wherein the interface structure comprises a thermal insulation system.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

DETAILED DESCRIPTION

Figure 1:
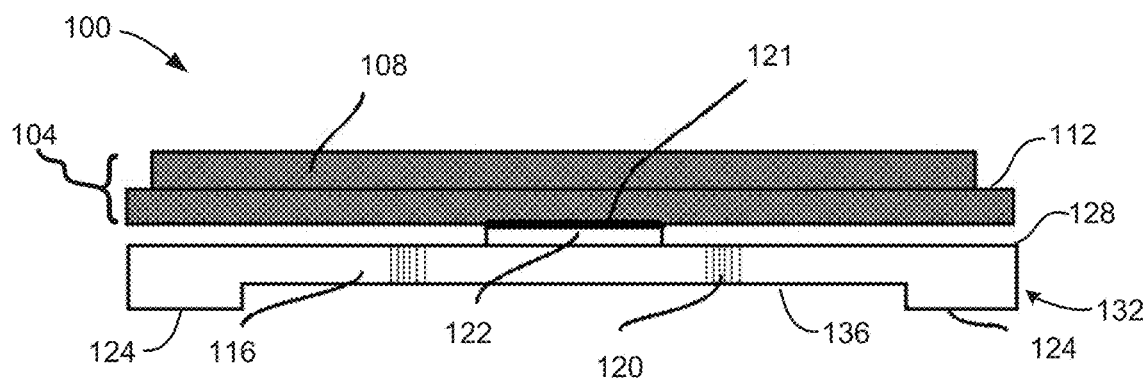
FIG. 1 is an assembly side view showing a sensor system in accordance with one embodiment of the invention.

In the following description of embodiments of the invention, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Embodiments of the invention relate to the methodology and mechanical implementation of a Microelectromechanical Systems (MEMS) embedded thermal stress isolation and stabilization system. The function of the system is to mitigate the negative impact of mounting stresses, more specifically stresses caused by thermal material mismatch between MEMS sensor and external packaging, on MEMS sensor performance. The system is also designed to allow for low power temperature stabilization of the sensitive MEMS sensor die which ensures the die is in an optimal temperature state for maximum performance in a changing thermal environment.

Embodiments of the invention provide a MEMS thermal stress isolation and thermal stabilization system including a supplemental interface structure integrated into the MEMS stack for thermal insulation and thermomechanical isolation and an embedded current carrying conductive element for applying a heat input to the system. In conjunction, these two hardware changes to the MEMS die allow for the system to operate at maximum sensor performance across temperature as they protect the sensor die from the transfer of thermomechanical stresses through the package-die attachment and allow for low power sensor temperature stabilization.

MEMS Thermal Stress Isolation System

In many high performance MEMS sensor systems, the MEMS sensor die is sealed in a package that is both hermetic and under vacuum. In this case, the primary form of heat transfer between the MEMS sensor die and package is conduction through the die attachment point, as the vacuum serves to limit conduction and radiation heat transfer. The design of the MEMS integrated insulating structure is to thermally and mechanically insulate the silicon MEMS sensor from the external packaging by limiting thermal conduction through the die attachment.

The first insulating feature of the design is that the structure is to be fabricated from Pyrex, due to the material's low thermal conductivity which makes it a quality insulator. Pyrex also CTE matches closely with silicon, which makes it a very compatible material. It will be appreciated that other materials may be used for the interface structure, such as amorphous glass or ceramic, fused silicon, other porous silicate glasses or other materials that feature low thermal conductivity and that have a CTE that is similar to or closely matches the material of the MEMS die. It will also be appreciated that for MEMS die made from materials other than silicon, other similar materials having low thermal conductivity and a CTE that is similar to or closely matches the material of the MEMS die may be used.

The design of the insulating structure is another feature that improves the insulating capability. The pattern of the interface structure is specifically designed to increase the length of thermal conduction path between the silicon MEMS die and the package die attachment. Pictured in Configuration 1 (FIGS. 1-2) and Configuration 2 (FIGS. 3-4), the insulating structure design features a symmetric geometry with attachments at the middle on one side of the structure and at the edges on the other side and an annular network of slots about the central node. In combination, the alternating central node, perimeter edge attachment points and the annular slots far increase the length of the thermal conduction path between MEMS die and package for this form factor. This increased thermal conduction path design serves to make the integrated wafer far superior as a thermal insulator. The impact of this increase in thermal insulation is to limit the transfer of heat from the die to the external package in order to dramatically decrease the power required for thermal stabilization. In many low power systems this dramatic decrease in power is the difference in whether this solution is viable. Additionally the symmetry and insulating nature of the MEMS integrated wafer helps to improve the temperature uniformity across the sensor die which helps to improve sensor performance stability.

Figure 2:
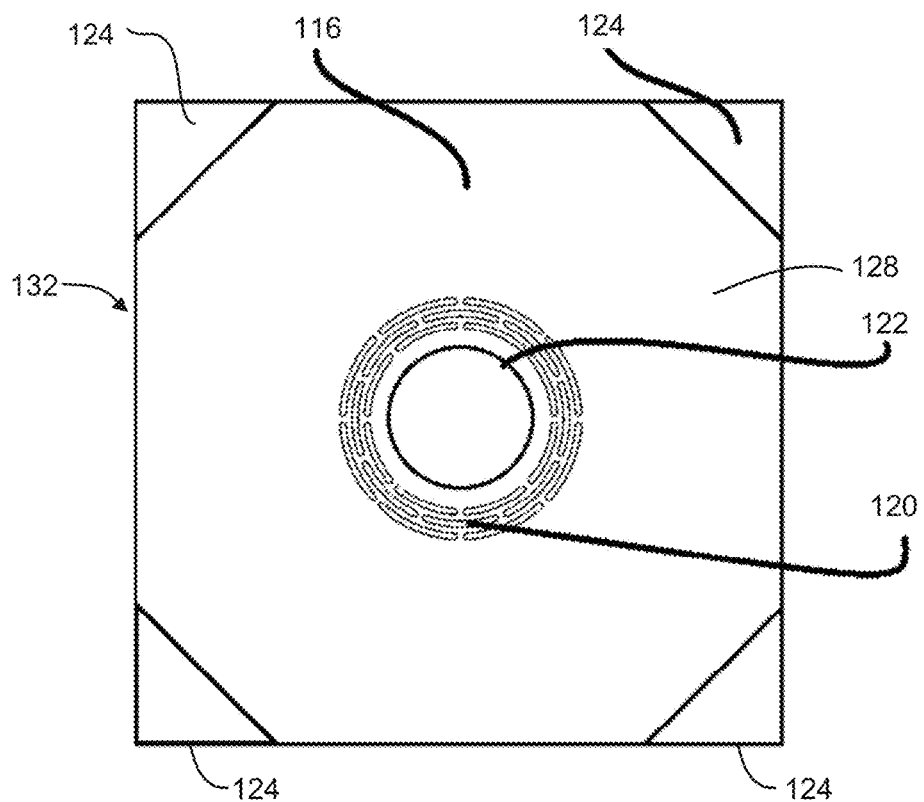
FIG. 2 is an assembly bottom view of the sensor system of FIG. 1 in accordance with one embodiment of the invention.

FIG. 1 illustrates a MEMS sensor 100 in accordance with one embodiment of the invention. As shown in FIG. 1, the MEMS sensor 100 includes a MEMS stack 104, which includes a MEMS device 108 and a support layer 112. The MEMS sensor 100 further includes an interface (or interposer) structure 116. The interface structure 116 includes a stress isolation network 120. FIG. 2 illustrates a more detailed view of the interface structure 116 showing the details of the stress isolation network.

As shown in FIGS. 1 and 2, in one embodiment, the interface structure 116 is bonded to the MEMS stack 104 at an interface 121 of a central node 122 and to the package (not shown) at raised nodes 124 located at its four corners. This configuration maximizes the interface structure's impact on thermomechanical isolation between the package and the MEMS by lengthening the thermal path and aligning directly with the alignment axis of the MEMS in the attachment interface. However, due to foreseeable issues when wafer dicing this configuration, this design may not be optimal for fabrication at the wafer level, making it better suited for individual die bonding attachment processes.

The interface structure 116 is designed to isolate the sensitive MEMS device 108 from external stresses caused by rigid attachment to packaging to allow the sensor to perform with improved immunity to the negative impacts of rigid sensor packaging attachment. The interface structure 116 may be a planar, micro-etched wafer integrated into the MEMS wafer stack which serves as a mechanical connection between the MEMS sensor 100 and the external packaging. The interface structure 116 is sized to match the square dimension of the MEMS stack 104 in plane with sufficient thickness to maintain mechanical rigidity for stabilizing alignment between the MEMS device 108 and the package (not shown). The mounting nodes for the interface structure 116 is a raised centrally located node 122 on the top side 128 of the interface structure 116 and raised nodes 124 located at the perimeter 132 on the bottom side 136 of the interface structure 116.

This bonding configuration of the interface structure 116 lengthens the thermal path from MEMS device 108 to the package (not shown) to provide some thermal isolation. The symmetric bonding scheme between the MEMS stack 104 and interface structure 116 also ensure that stresses are not transferred to the MEMS device 108 asymmetrically.

Figure 3:
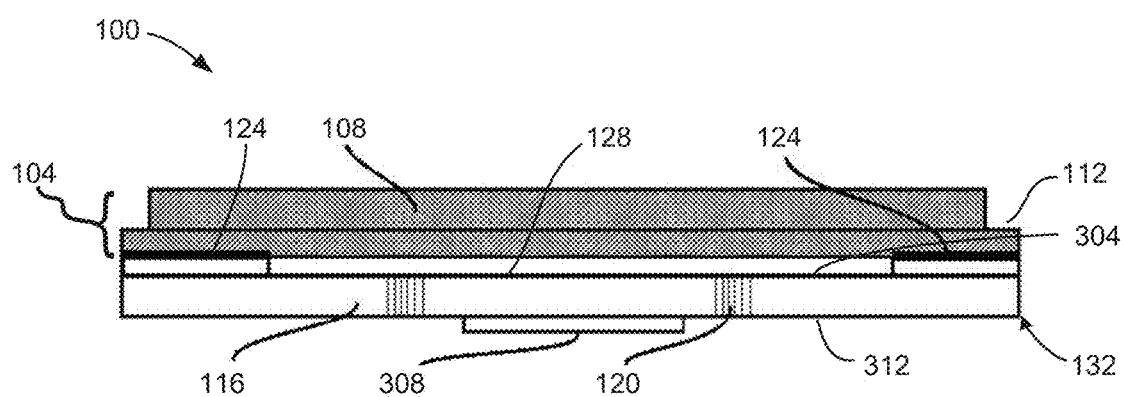
FIG. 3 is an assembly side view showing a sensor system in accordance with one embodiment of the invention.
Figure 4:
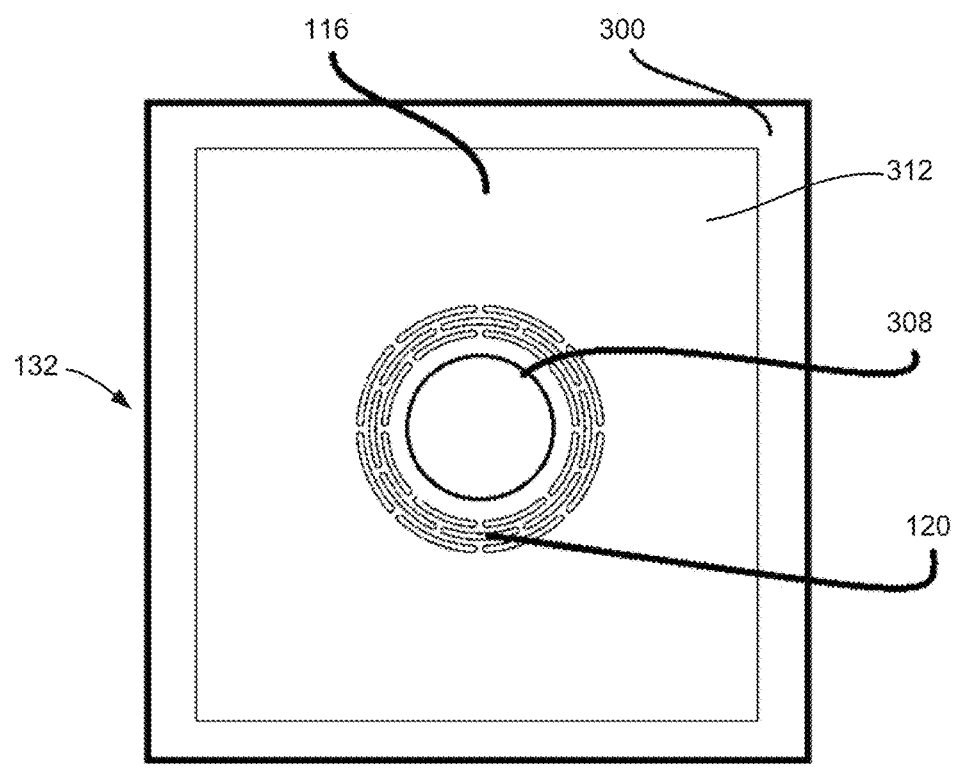
FIG. 4 is an assembly bottom view of the sensor system of FIG. 3 in accordance with one embodiment of the invention.

FIGS. 3 and 4 illustrate an alternative embodiment in which the interface structure 116 is bonded to the MEMS stack 104 at the square perimeter 300 of the interface structure 116 on the top side 304 of the interface structure 116 and is bonded to the package (not shown) at a central circular node 308 at the bottom side 312 of the interface structure 116. This configuration, though slightly less optimal for thermomechanical isolation, eliminates possible issues with wafer dicing and allows for integration into current MEMS fabrication processes at the wafer level.

The interface structure 116 is fabricated from a material that increases the thermal insulation of the MEMS stack 104 from the external package and protects the MEMS resonator from thermomechanical stresses prorogating through the rigid mount. For example, the interface structure 116 may be made from Pyrex. The thermal conductivity of Pyrex is two orders of magnitude lower than silicon making it viable as a thermal insulator. Pyrex is also coefficient of thermal expansion (CTE)-matched to silicon to minimize the transfer of thermomechanical stresses between the MEMS and the interface wafer across temperature.

Figure 5:
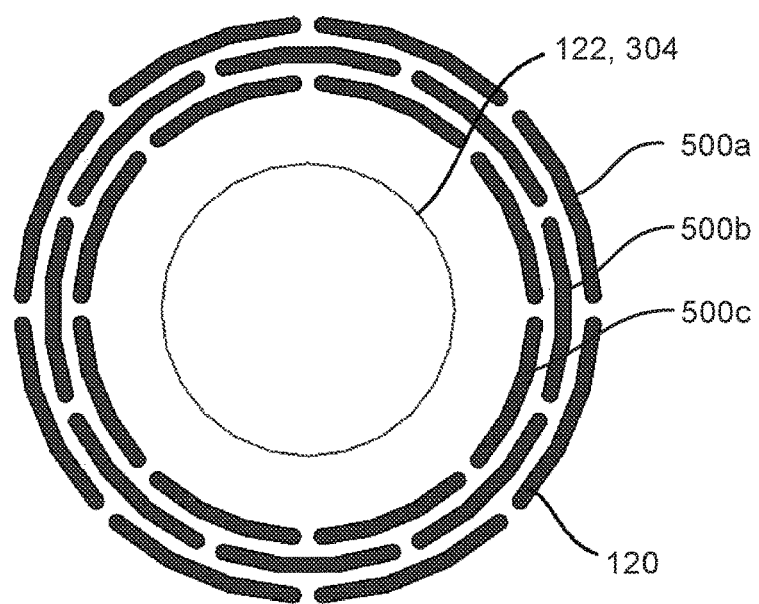
FIG. 5 is a schematic view of shows a mechanical shock and vibration isolation interposer in accordance with one embodiment of the invention.

As explained above, the interface structure 116 also contains a stress isolation network 120. The stress isolation network 120 is a mechanical network designed into the interface structure 116 to mechanically isolate the MEMS stack 104 from the package (not shown). As shown in greater detail in FIG. 5, the stress isolation network 120 includes three concentric annular rings 500a, 500b, 500c offset in an alternating pattern, which are etched through the interface structure 116 about the central bonding node 122, 308. The stiffness of the stress isolation network 120 is designed to be within a threshold that will allow the stress isolation network 120 to be stiff enough to be the rigid mount but soft enough to perform as a mechanical isolator. More specifically, the lower bound for minimum stiffness will ensure that the stress isolation network 120 will maintain rigidity in the mounting axis alignment during mechanical shock and vibration. The stress isolation network 120 will also be stiff enough such that the interface structure 116 has a much higher resonant frequency than the MEMS resonator so vibrational interference between structures is avoided. The upper bound for stiffness of the stress isolation network 120 will ensure that the stress isolation network 120 will be soft enough for the stress isolation network 120 to act as a shock and vibration absorber to resolve stresses from transferring from the package to the MEMS device 108 through the interface structure 116. In each case, the design of this stress isolation network 120 is customized to conform to the size and weight of the MEMS stack 104 it is to support, which means that the dimensions of the stress isolation network 120 will change with each MEMS design.

It will be appreciated that although the stress isolation network has been illustrated as three concentric rings, it will be appreciated that any other symmetrical, concentric polygonal shape may be used as known to those of skill in the art. Likewise, although three concentric rings are illustrated, it will be appreciated that more than three rings or other polygonal shapes may be used.

The interface wafer may be fabricated using, for example, a reactive ion etching (RIE) process. Bonding between the interface structure 116 and MEMS stack 104 may be done using an anodic bond which is a known scalable process capable of integration into MEMS fabrication.

MEMS Thermal Stabilization System

Figure 6:
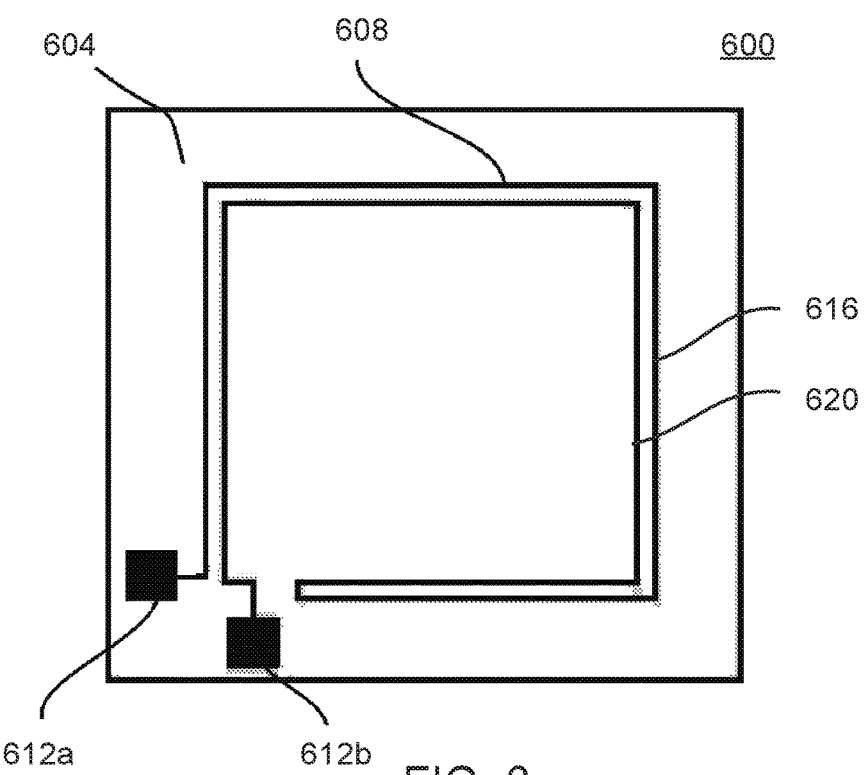
FIG. 6 is a schematic view of a MEMS embedded heating element in accordance with one embodiment of the invention.

FIG. 6 illustrates an embedded MEMS thermal stabilization system 600 in accordance with embodiments of the invention. The embedded MEMS thermal stabilization system 600 is designed to control the temperature of the sensitive components of the MEMS sensor system, specifically the silicon die, to a fixed temperature setpoint to minimize the impact of thermal fluctuation on sensor performance while minimizing the power required for thermal stabilization.

The MEMS thermal stabilization system 600 is a MEMS embedded temperature control system and a MEMS integrated thermal insulation structure for thermally insulating the MEMS device from the external packaging. The embedded temperature control system 604 is a closed loop system made up of an embedded resistor or heating element 608 and an external controller (not shown).

The heating element 608 is one or more electrically conductive traces embedded within the MEMS device 108. The heating element 608 is electrically paired with a voltage source (not shown) to flow current through the heating element 608 in order to change the electrical energy into thermal energy used as heat input for the system. The embedded nature of the heating element 608 allows the MEMS device to be heated from within, localizing the heat input for the resonator and reducing the power for thermally stabilizing the system.

In one embodiment, the heating element 608 includes two metallic traces; it will be appreciated that any conductive material may be used, such as gold, aluminum, copper or the like. It will be further appreciated that the heating element may include a semiconductive material, such as a doped silicon or other similar material. In some embodiments, the traces have a resistance of 20-100 ohms, a range designed for integration with a low power temperature controller.

In one particular embodiment, the heating element 608 is made from the same material as the electrodes in the MEMS device. In one embodiment, the embedded conductive element is integrated into the silicon MEMS device as an electrical trace in the metallization process step.

The traces may be symmetrically patterned to input heat in a pattern tailored to utilize the natural thermal conductivity of the silicon to minimize the thermal gradients across the MEMS, a feature that serves to improve sensor performance stability. Additionally, the design of the embedded heating element 608 limits the magnitude of the magnetic fields produced by the flowing current, which also positively impacts device performance.

As shown in FIG. 6, the embedded heating element 608 loops around the MEMS device 108 to flow current both clockwise and counterclockwise in adjacent traces 616, 620. This design of this heating element 608 symmetrically distributes temperature across the MEMS die as well as limiting the magnitude of the magnetic field produced by the heater by changing the direction of the flow of current in each loop to create fields that cancel one another. The traces 616, 620 are designed to connect electrically to the rest of the temperature controller system through metalized bond pads 612a, 612b at the corner of the MEMS die that are electrically coupled to the voltage source and the traces 616, 620.

As a system, the temperature controller works as any closed loop system, utilizing an input, an output, and a feedback loop for system control. The input to the system is the thermal energy applied to the MEMS which is controlled by the amount of electrical current run through the embedded heating element 608. Thus, the true input to the temperature control system is a voltage which can be adjusted to control the amount of heat applied to the MEMS. The output and controlled variable of the system is the temperature of the MEMS. In MEMS that have thermocouples designed into their hardware, the temperature of the MEMS can be calculated simply with this measurement tool. In MEMS with no thermocouples designed into their hardware, this temperature can often be closely estimated using the resonating frequency of the MEMS device. Due to the nature of this type of thermal stabilization which requires the MEMS to be controlled to a single fixed temperature, potential limitations in performance that result from weakness in regressing the relationship between resonant frequency and temperature are greatly reduced. With required input and output needed for closed loop control in place, the feedback and control for the system can be performed using a PID (proportional-integral-derivative) controller embedded within an external processor.

Figure 7:
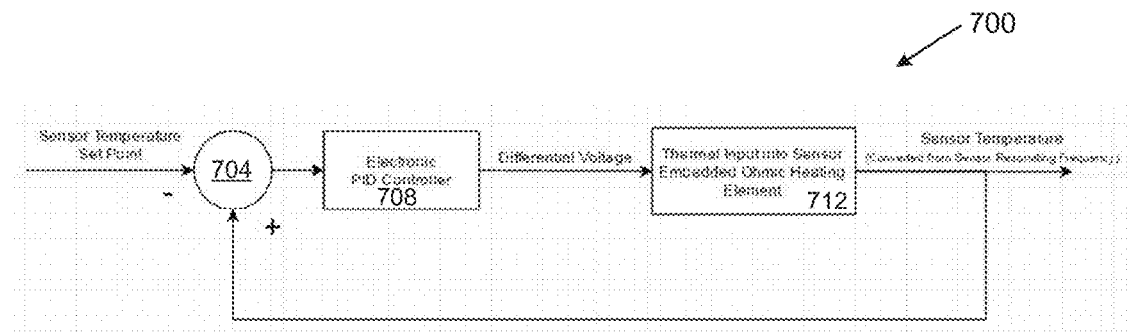
FIG. 7 is a block diagram of a temperature control system in accordance with one embodiment of the invention.

FIG. 7 illustrates an exemplary temperature control system. As shown in FIG. 7, the temperature control system 700 includes a voltage source 704, an electronic PID controller 708, a thermal input into sensor embedded ohmic heating element 710 arranged in a feedback loop. The voltage source 704 receives a sensor temperature set point and provides that input to the PID controller 708. The PID controller 708 outputs a differential voltage which is delivered to the sensor embedded ohmic heating element 710, which outputs a sensor temperature. The sensor temperature is provided back to the voltage source 704. The sensor temperature is converted into a sensor resonating frequency.

Figure 8:
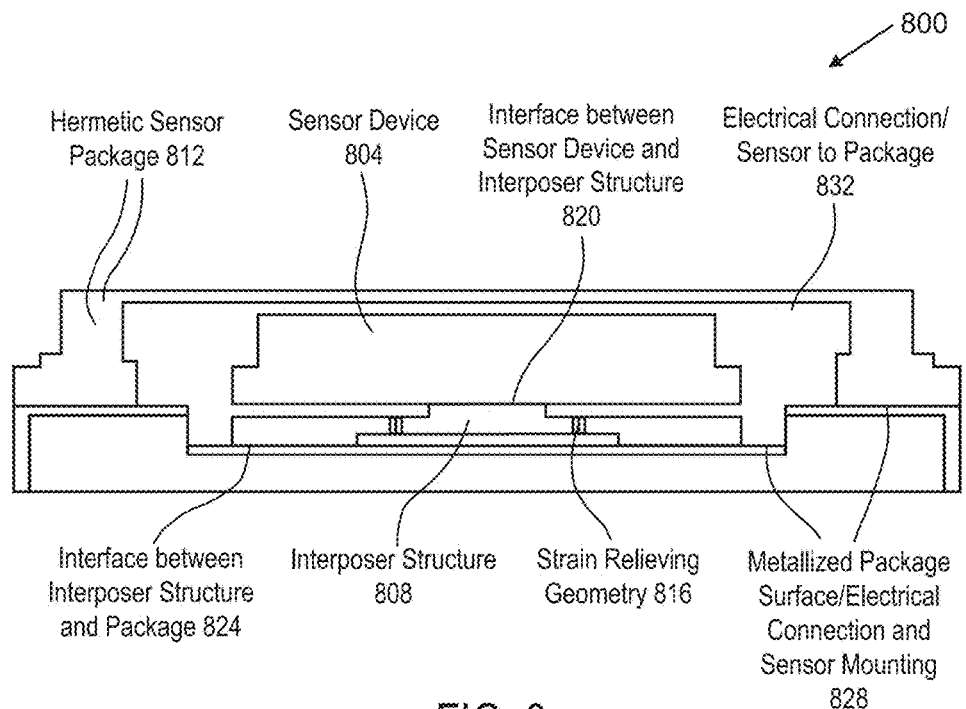
FIG. 8 is a cross-sectional view of a packaged sensor system in accordance with one embodiment of the invention.

FIG. 8 illustrates a cross-sectional view of the MEMS sensor device and interposer or interface structure arranged in the external packaging. As shown in FIG. 8, the sensor 800 includes the MEMS sensor device 804, interposer structure 808, and external packaging 812. As shown in FIG. 8 and described above, the interposer structure 808 includes a stress relieving feature 816 and is mechanically connected (e.g., bonded) to the MEMS sensor device 804 and external packaging at interfaces 820 and 824. As described above, in one embodiment, as shown in FIG. 8, the mechanical connection between the MEMS sensor device 804 and the interposer structure 808 is at a central location of the devices, and the interposer structure 808 is mechanically connected to the external packaging at its periphery; however, in other embodiments, as described above, the connections may be reversed. The external packaging 812 includes a metallized package surface 828 for electrical connection and sensor mounting. The sensor further includes electrical connections 832 between the MEMS sensor device 804 and the metallized package surface 828. In some embodiments, the MEMS sensor device 804 is hermetically sealed in the external packaging 812.

An advantage of the invention is that the interposer structure provides a longer thermal path from the MEMS sensor device to the external packaging through the interposer structure, which improves the temperature uniformity across the sensor and limits the input power required to make the configuration an efficient solution.

Another advantage of the invention is that it reduces chipping, which is a mechanical bending of the structures into a "potato chip" looking configuration, which occurs in the prior art designs. This is a potential problem for sensors that are hard mounted to substrates that flex and bend over temperature and external mechanical forces. The stress relief features built into the interposer structure reduce the impact of the package on the sensor by resolving the stress built up when the package is flexing under environmental conditions (i.e. "potato chipping") so that it is not transferred to the sensor.

An advantage of hermetically sealing the sensor in a vacuum environment is that the thermal conductivity in a vacuum is zero for both conduction and convection heat transfer, which means it is a great thermal insulator.

Due to the use of materials and techniques typical to MEMS fabrication processes, manufacture of both the MEMS thermal stress isolation system and the thermal stabilization system can be integrated at both the device and wafer level.

The invention has been described in relation to particular examples, which are intended in all respects to be illustrative rather than restrictive. Those skilled in the art will appreciate that many different combinations will be suitable for practicing the present invention. Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A sensor comprising:
an external packaging including an internal cavity having a bottom surface, the external packaging including an upper surface enclosing the internal cavity;
a MEMS sensor device hermetically sealed in the external packaging; and
an interposer structure mechanically connected to the MEMS sensor device and the bottom surface of the internal cavity, the interposer structure including a stress isolation network mechanically and thermally insulating the MEMS sensor device from the external packaging, the stress isolation network comprising a plurality of concentric annular rings formed by a plurality of slots about a central bonding node and offset in an alternating pattern in order to increase a thermal path between the MEMS sensor device and the external packaging.

2. The sensor of claim 1, wherein a first material forming the interposer structure and a second material forming the MEMS sensor device have substantially matching thermal expansion coefficients.

3. The sensor of claim 1, wherein the MEMS sensor device includes a thermal stabilization system configured to control a temperature of the MEMS sensor device.

4. The sensor of claim 3, wherein the thermal stabilization system determines the temperature of the MEMS device by measuring a resistance of a metallic trace between two electrical connectors, and wherein the thermal stabilization system controls the temperature of the MEMS device by modulating current flow through the metallic trace.

5. The sensor of claim 3, wherein the thermal stabilization system comprises:
a metallic trace;
a voltage source;
a first bond pad coupled to the voltage source and a first end of the metallic trace; and
a second bond pad coupled to the voltage source and a second end of the metallic trace.

6. The sensor of claim 3, wherein the thermal stabilization system symmetrically distributes heat across the MEMS sensor device.

7. The sensor of claim 1, wherein the interposer structure contacts the MEMS sensor device at the central bonding node.

8. The sensor of claim 1, wherein the plurality of concentric annular rings are three concentric annular rings offset in an alternating pattern about the central bonding node.

9. The sensor of claim 1, wherein the MEMS sensor device and interposer structure are hermetically packaged in a vacuum environment for maximum thermal insulation.

10. The sensor of claim 1, wherein the plurality of concentric annular rings are fabricated into the interposer structure.

11. A sensor comprising:
an external packaging including an internal cavity having a bottom surface, the external packaging including an upper surface enclosing the internal cavity;

a MEMS sensor device located within the external packaging and comprising a thermal stabilization system; and an interposer structure mechanically connected to the MEMS sensor device and the bottom surface of the internal cavity, wherein the interposer structure comprises a plurality of concentric annular rings formed by a plurality of slots about a central bonding node and offset in an alternating pattern in order to increase a thermal path between the MEMS sensor device and the external packaging.

12. The sensor of claim 11, wherein the interposer structure comprises a material with low thermal conductivity.

13. The sensor of claim 11, wherein the thermal stabilization system is configured to measure and control a temperature of the MEMS sensor device.

14. The sensor of claim 11, wherein the central bonding node is at a central location of both the MEMS sensor device and the interposer structure.

15. The sensor of claim 14, wherein the mechanical connection between the MEMS sensor device and interposer structure is at the central bonding node, and wherein the mechanical connection between the interposer structure and the bottom surface of the internal cavity is at a plurality of locations at a periphery of the interposer structure.

16. The sensor of claim 11, wherein the central bonding node is at a central location of both the interposer structure and the bottom surface of the internal cavity.

17. The sensor of claim 16, wherein the mechanical connection between the MEMS sensor device and the interposer structure is at a plurality of locations at a periphery of both the MEMS sensor device and the interposer structure, and wherein the mechanical connection between the interposer structure and the bottom surface of the internal cavity is at the central bonding node.

18. The sensor of claim 11, wherein the plurality of concentric annular rings are fabricated into the interposer structure.

19. The sensor of claim 11, wherein the MEMS sensor device and interposer structure are hermetically packaged in a vacuum environment for maximum thermal insulation.

20. The sensor of claim 11, wherein the thermal stabilization system comprises an embedded heating element configured to generate and distribute heat across the MEMS sensor device and thermally insulate the MEMS sensor device from the external packaging.

21. The sensor of claim 20, wherein the embedded heating element comprises:
    a metallic trace;
    a voltage source;
    a first bond pad coupled to the voltage source and a first end of the metallic trace; and
    a second bond pad coupled to the voltage source and a second end of the metallic trace.

22. The sensor of claim 21, wherein a direction of current flow through the metallic traces is mirrored to offset the magnetic field introduced by the flow of current through the thermal stabilization system.

23. The sensor of claim 11, wherein the thermal stabilization system symmetrically distributes heat across the MEMS sensor device.

* * * * *